United States Patent
Chen et al.

[11] Patent Number: 5,593,921
[45] Date of Patent: Jan. 14, 1997

[54] METHOD OF FORMING VIAS

[75] Inventors: Fusen E. Chen, Dallas; Fu-Tai Liou, Carrollton; Girish A. Dixit, Dallas, all of Tex.

[73] Assignee: SGS-Thomson Microelectronics, Inc., Carrollton, Tex.

[21] Appl. No.: 438,167

[22] Filed: May 9, 1995

Related U.S. Application Data

[62] Division of Ser. No. 150,762, Nov. 12, 1993, abandoned, which is a continuation of Ser. No. 763,947, Sep. 23, 1991, abandoned.

[51] Int. Cl.⁶ .................................................. H01L 21/441
[52] U.S. Cl. ..................... 437/195; 437/235; 437/978; 437/228; 148/DIG. 43; 148/DIG. 118; 156/657.1
[58] Field of Search ....................... 437/195, 235, 437/238, 978, 228; 148/DIG. 43, DIG. 118; 156/657.1

[56] References Cited

U.S. PATENT DOCUMENTS

| | | | |
|---|---|---|---|
| 4,523,372 | 6/1985 | Balda et al. | 29/590 |
| 4,894,351 | 1/1990 | Batty | 437/190 |
| 4,902,533 | 2/1990 | White et al. | 427/99 |
| 5,060,050 | 10/1991 | Tsuneoka et al. | 257/750 |
| 5,110,712 | 5/1992 | Kessler et al. | |
| 5,252,516 | 10/1993 | Nguyen et al. | 437/195 |

FOREIGN PATENT DOCUMENTS

| | | |
|---|---|---|
| 0154419 | 9/1985 | European Pat. Off. |
| 0241729 | 10/1987 | European Pat. Off. |
| 0249173 | 12/1987 | European Pat. Off. |
| 0388862 | 9/1990 | European Pat. Off. |

*Primary Examiner*—George Fourson
*Assistant Examiner*—C. Everhart
*Attorney, Agent, or Firm*—Theodore E. Galanthay; Kenneth C. Hill; Lisa K. Jorgenson

[57] ABSTRACT

A method is provided for forming a contact opening or via of a semiconductor integrated circuit, and an integrated circuit formed according to the same. A first metal region is formed over an underlying region. A first insulating layer is formed over the integrated circuit. A second insulating layer is then formed over the first insulating layer. A portion of the second insulating layer is etched to expose a portion of the first insulating layer wherein the exposed first insulating layer and the remaining second insulating layer form a substantially planar surface. A metal oxide layer is formed over the exposed first insulating layer and the remaining second insulating layer. A photoresist layer is formed and patterned over the metal oxide layer. The metal oxide layer is then selectively etched to form a via exposing a portion of the first insulating layer. The first insulating layer in the via is then selectively etched to expose a portion of the first metal region. The photoresist layer is removed and a second metal layer is then formed over the metal oxide layer and in the via contacting the first metal region.

12 Claims, 2 Drawing Sheets

METHOD OF FORMING VIAS

This is a division of application Ser. No. 08/150,762, filed Nov. 12, 1993, now abandoned, which is a continuation of application Ser. No. 07/763,947, filed Sep. 23, 1991, now abandoned.

1. Field of the Invention

The present invention relates generally to semiconductor integrated circuits, and more specifically to a structure and method of forming vias.

2. Background of the Invention

As integrated circuit devices become more complex and increased device density becomes a necessity, greater numbers of interconnect levels are required to connect the various portions of the device. Complex devices are being designed which have two or more levels of polycrystalline silicon interconnect, followed by one or more levels of metal interconnect. One of the more critical process steps is the interconnection of two metal or conducting layers on different levels separated by an interlevel dielectric.

Presently, an underlying conductive layer is covered with an interlevel oxide layer. The interlevel oxide layer follows the topography of the underlying conductive layer. A contact or via is then formed through the interlevel layer exposing a selected area of the surface of the underlying conductive layer. An upper conducting layer is then patterned and interconnected through the contact or via to the underlying conducting layer.

Historically, the size of the via was typically smaller than the width of the underlying conductive layer in order to compensate for any mask misalignment. If any misalignment occurred whereby a part of the via extended beyond the width of the underlying conductive layer, it was probable to etch through the interlevel oxide into the substrate or layer underlying the oxide to the side of the conductive layer.

The prior art, shown in FIG. 1, illustrates the problem. Metal conductive regions 32 and 34 are formed over an underlying region 30. An interlevel oxide layer 36 is formed over the surface of the integrated circuit following the topography of the metal regions 32, 34 and the underlying region 30. Contact opening or via 38 is formed through the interlevel oxide 36 to expose a portion of the metal region 32. Metal layer 32 will interconnect with an overlying metal layer. However, if there is a mask misalignment, the contact or via 38 will be etched through the junction between layer 36 and region 30 into the underlying layer 30. When a subsequent metal layer 40 is formed to interconnect with metal layer 32, layer 40 will also contact the underlying layer 30 in the bottom of via 38 at the region shown as 42.

Where metal layer 40 interconnects layer 30 at region 42, the integrity of the interconnection between metal layers 32 and 40 will be compromised. A short circuit condition may exist between layer 40 and an underlying layer 30. There may also be leakage current if there is a transistor under metal layer 32 causing substantial degradation of the transistor. In other words, there may be short circuit conditions between metals and doped polysilicon formed in different levels or there may be short circuit conditions between metals formed in the same levels.

It would be desirable to provide a process for fabricating semiconductor devices, and structures formed thereby, which increases device density through the use of smaller metal interconnects while preventing leakage current or a short circuit condition. It is desirable for such technique to provide a smaller enclosure for the underlying metal region of the interconnect without causing degradation of device functionality. It would further be desirable to provide an interconnect which is very nearly planar on its upper surface. It is also desirable for such a technique to be compatible with present day manufacturing processes, and be relatively simple to use.

SUMMARY OF THE INVENTION

The invention may be incorporated into a method for forming an integrated circuit, and the integrated circuit formed thereby, by forming a contact opening or via which ensures the integrity of the interconnect between two layers of metal. A first conductive region is formed over an underlying region. A substantially planar insulating layer is then formed over the first conductive region with an opening therethrough exposing a portion of the first conductive region. A metal oxide layer is formed over the substantially planar insulating layer. A second conductive layer is then formed over the metal oxide layer and in the opening over the exposed portion of the first conductive region.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
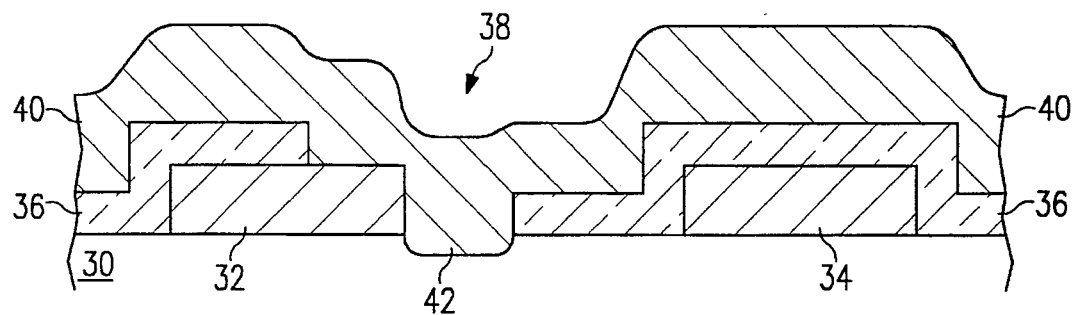
FIG. 1 is a cross-sectional view of the fabrication of a semiconductor device structure according to the prior art.
Figure 2:
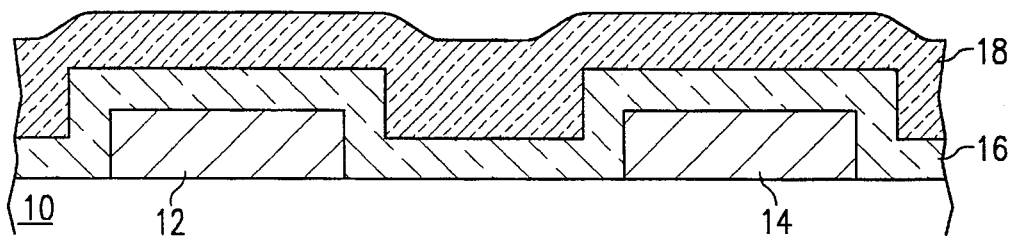
FIGS. 2–4, 5A, 5B, 6A and 6B are cross-sectional views of the fabrication of a semiconductor device structure according to the present invention.

Referring to FIG. 2, a first conductive layer shown as regions 12 and 14 are to be formed over an underlying region 10 by methods known in the art. Regions 12, 14 will typically be the first and underlying metal regions of a subsequently manufactured interconnect. Regions 12, 14 will have a thickness of between approximately 5000 to 8000 angstroms. These regions may also typically be formed from an aluminum or a refractory metal. For simplicity, these regions will be referred to herein as metal regions. Also, for purposes of illustrating this invention, only an interconnect formed with region 12 will be depicted.

The underlying region 10 or various portions of region 10 may be a substrate, an oxide layer, or an active area such as a source/drain region of a transistor or the gate of a transistor (not shown). While regions 12, 14 are formed from the same metal layer, regions 12, 14 do not need to lie necessarily in the same plane on the integrated circuit.

A first interlevel dielectric layer 16 is an insulating layer formed on the integrated circuit. Layer 16 will typically be a plasma oxide layer having a thickness of approximately 5000 angstroms. A second interlevel dielectric layer 18 is also an insulating layer formed over layer 16. This upper layer 18 tends to form a more planar surface than the underlying features. Layer 18 may typically be a spin-on-glass or a polyimide or any material that can be applied to planarize the surface and subsequently be etched back such as photoresist. Layer 18 will have a thickness of between approximately 3000 to 5000 angstroms. Device fabrication up to this stage utilizes conventional process steps well known in the art.

Figure 3:
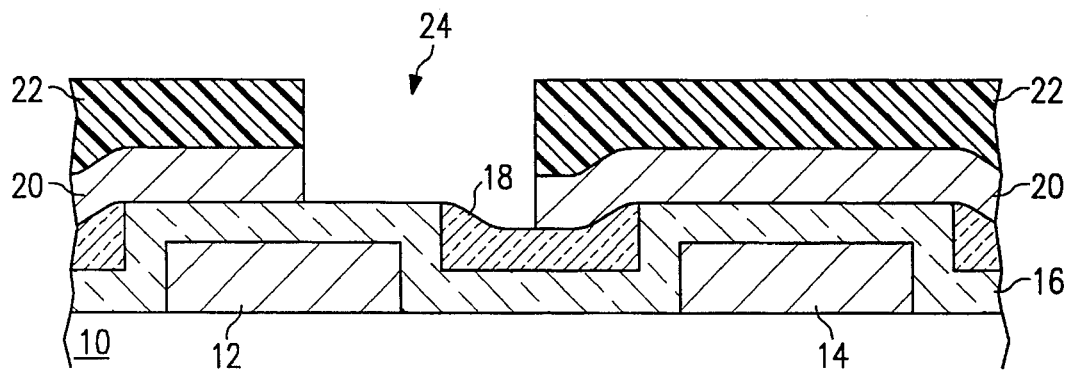

Referring to FIG. 3, the second insulating layer 18 is etched to form a substantially planar surface with a total thickness of approximately that of the first insulating layer 16. This etch step will thus expose a portion of the first insulating layer 16 while layer 18 remains in the uneven areas to form the more planar surface.

A metal oxide layer 20 is then deposited over the surface of the first and second interlevel dielectric layers 16 and 18 to increase the overall interlevel dielectric region between metal 12 and an upper level interconnect. The increase in the overall thickness of the dielectric region will reduce capacitance thus increasing circuit performance. Metal oxide layer 20 can be formed from any material which is an electrical insulator such as a refractory metal oxide or an aluminum oxide. Layer 20 will typically have a thickness of approximately 5000 angstroms. Additionally, metal oxide layer 20 and its etch chemistry should be chosen such that layer 20 may be selectively etched over the underlying interlevel dielectric layers 16 and 18. Similarly, the interlevel dielectric layers 16 and 18 and their etch chemistries should be chosen such that they etch at substantially the same rate and may be selectively etched over the material chosen for the underlying metal layer 12.

A photoresist layer 22 is formed over the device and patterned to define a contact opening or via 24 in which a contact will be made to the underlying metal region 12. The exposed portion of the metal oxide layer 20 is then selectively etched away within the via 24 without removing significant portions of the underlying interlevel dielectric layers 16 and 18.

Figure 4:
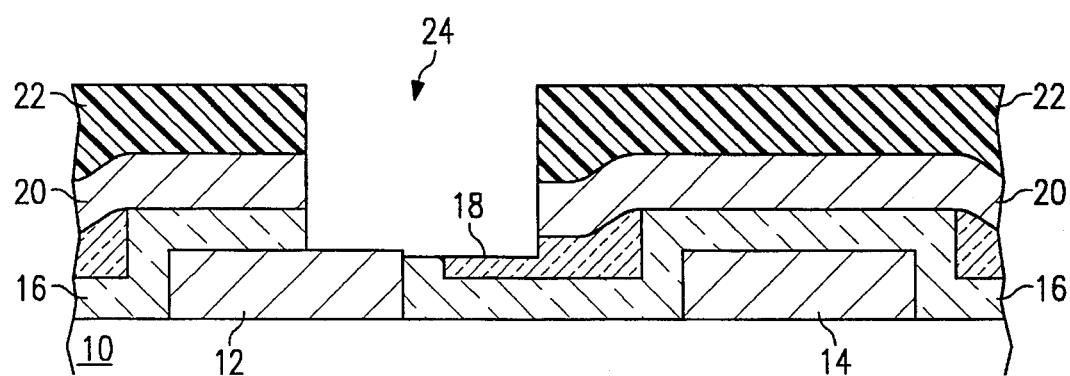

Referring to FIG. 4, the interlevel dielectric layers 16 and 18 are etched in the via 24 to expose a portion of the metal region 12. The dielectric layers 16 and 18 will etch away within the via 24 at substantially the same rate and will overetch to a depth slightly lower than the upper surface of the metal region 12. As shown in FIG. 4, misalignment of the via 24 is not critical where the interlevel dielectric layers are substantially planar. The interlevel dielectric layer 16 will not be etched such that penetration of the junction between layer 16 and the underlying region 10 occurs.

Figure 5A:
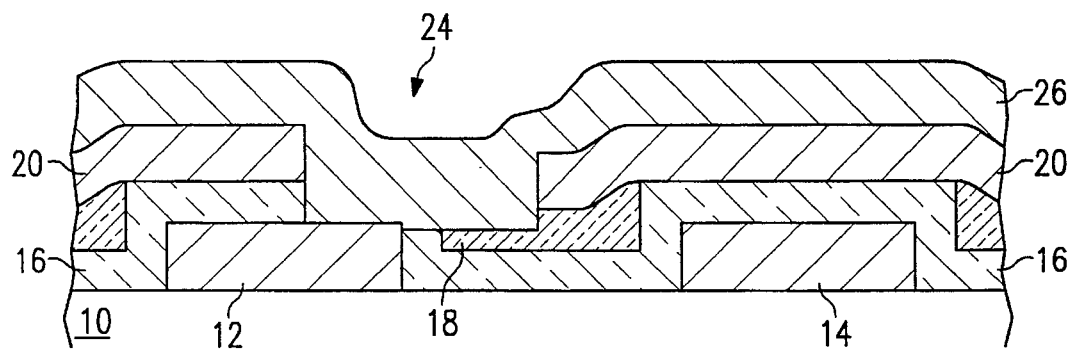

Referring to FIG. 5A, photoresist layer 22 is removed. A second conductive layer 26 is then formed over the metal oxide layer 20 and in the via 24. Layer 26 will typically have a thickness of between approximately 5000 to 8000 angstroms and will form the upper layer of an interconnect with the first conductive region 12. Since there is no etching through the junction between layer 16 and region 10, no short circuit condition will occur and there will be no leakage current as a result of the formation of the interconnect.

Figure 5B:
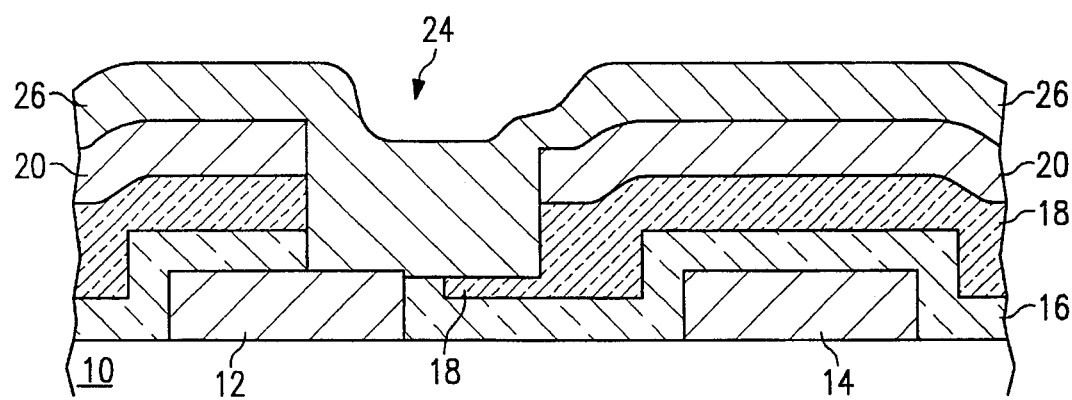

Referring to FIG. 5B, an alternative process is to first selectively etch the metal oxide layer 20. With this alternative, there is no etch back performed to thin out the interlevel dielectric layers 16 and 18 before the deposition of the metal oxide layer 20.

Figure 6A:
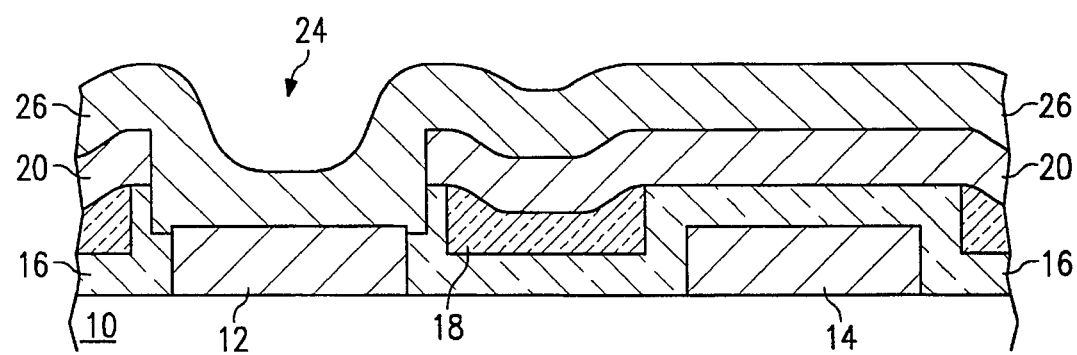
Figure 6B:
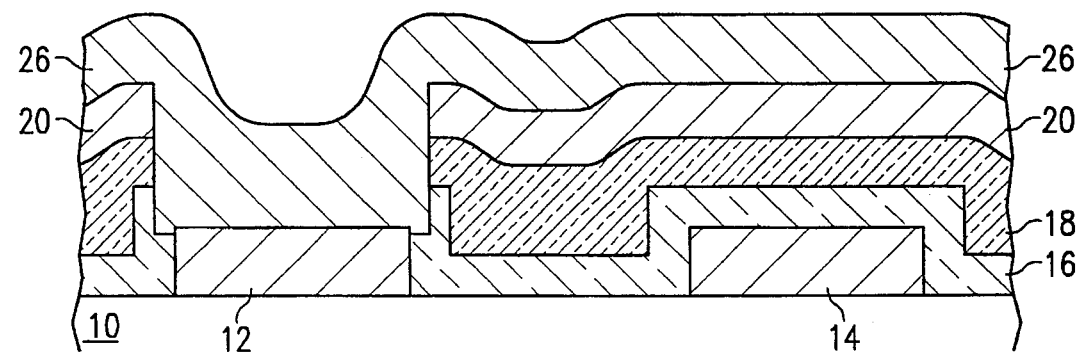

Referring to FIG. 6A, the via 24 may be larger than the metal region 12. Again, selectively etching the metal oxide layer 20 and then layers 16 and 18 on top of the metal region 12 will ensure that there is no overetching into region 10. The metal layer 26 which forms the upper layer of the interconnect with metal region 12 will not cause any short circuit conditions or leakage current. FIG. 6B illustrates the same conditions but without the etch back step of layer 18.

It will be appreciated by those skilled in the art that the method described above, and the structures formed thereby, provide for an interconnect which prevents short circuit and leakage current conditions. This technique does not allow for the etch of the interlevel dielectric layers to go deep into region 10. Misalignment of the via over the metal layer 12 can thus be tolerated allowing for a higher density of device fabrication. This technique further provides an interconnect layer which can be easily used to form multiple levels of metal interconnect without creating severe topographical features which make formation of later interconnect levels difficult.

While the invention has been particularly shown and described with reference to a preferred embodiment, it will be understood by those skilled in the art that various changes in form and detail may be made therein without departing from the spirit and scope of the invention.

What is claimed is:

1. A method of forming a via in a semiconductor integrated circuit, comprising the steps of:

forming a conductive structure over portions of an underlying region;

forming a conformal oxide layer over the conductive structure and the underlying region;

forming a planarizing oxide layer over the conformal oxide layer;

etching back the planarizing oxide layer to expose a portion of the conformal oxide layer over the conductive structure;

forming a metal oxide layer over the planarizing oxide layer and the exposed portion of the conformal oxide layer;

forming and patterning a resist layer over the metal oxide layer to define a selected via region;

etching the metal oxide layer to remove it from the selected via region, wherein the metal oxide etch is performed so as to selectively etch the metal oxide layer over the underlying conformal oxide layer;

etching the conformal oxide layer to remove it from the selected via region, wherein the conformal oxide etch is performed so as to selectively etch the conformal oxide layer over the metal oxide layer;

removing the resist layer; and forming an upper interconnect structure over the metal oxide layer and extending into the via to contact the conductive structure.

2. The method of claim 1, wherein the conductive structure comprises a metal interconnect layer.

3. The method of claim 1, wherein the upper interconnect structure comprises a metal interconnect later.

4. The method of claim 1, wherein the conformal oxide layer has a thickness of at least approximately 5000 angstroms.

5. The method of claim 1, wherein the planarizing oxide layer comprises a spin-on-glass layer.

6. The method of claim 1, wherein the planarizing oxide layer has a thickness of between approximately 3000 to 5000 angstroms before the etchback step.

7. The method of claim 1, wherein the metal oxide layer has thickness of approximately 5000 angstroms.

8. The method of claim 1, wherein the metal oxide layer is a refractory metal oxide.

9. The method of claim 1, wherein the metal oxide layer is an aluminum oxide.

10. The method of claim 1, wherein the etching back step also removes a portion of the conformal oxide layer.

11. The method of claim 1, wherein the conformal oxide layer and the planarizing oxide layer etch at approximately the same rate during the etchback step.

12. The method of claim 1, wherein the via has a width greater than a width of the conductive structure.

* * * * *